(12) United States Patent
Morosawa et al.

(10) Patent No.: US 9,178,072 B2
(45) Date of Patent: *Nov. 3, 2015

(54) THIN FILM TRANSISTOR AND DISPLAY DEVICE

(71) Applicant: JOLED INC., Tokyo (JP)

(72) Inventors: Narihiro Morosawa, Kanagawa (JP); Takashige Fujimori, Kanagawa (JP)

(73) Assignee: JOLED INC., Tokyo (JP)

( * ) Notice: Subject to any disclaimer, the term of this patent is extended or adjusted under 35 U.S.C. 154(b) by 291 days.

This patent is subject to a terminal disclaimer.

(21) Appl. No.: 13/665,487

(22) Filed: Oct. 31, 2012

(65) Prior Publication Data

US 2013/0056728 A1 Mar. 7, 2013

Related U.S. Application Data

(63) Continuation of application No. 12/654,658, filed on Dec. 29, 2009, now Pat. No. 8,426,851.

(30) Foreign Application Priority Data

Feb. 4, 2009 (JP) ................................. 2009-024035

(51) Int. Cl.
*H01L 29/10* (2006.01)
*H01L 29/786* (2006.01)
(Continued)

(52) U.S. Cl.
CPC ...... *H01L 29/7869* (2013.01); *H01L 29/41733* (2013.01); *H01L 29/45* (2013.01); *H01L 29/78606* (2013.01); *H01L 27/1225* (2013.01); *H01L 27/3262* (2013.01)

(58) Field of Classification Search
CPC ............ H01L 27/0203; H01L 27/1214; H01L 27/1225; H01L 27/3248; H01L 27/3274; H01L 29/4808; H01L 29/66765; H01L 2021/775; H01L 29/7869; H01L 29/41733; H01L 29/45; H01L 29/78606; H01L 27/3262
USPC .......... 257/40, 43, E29.095, E29.1, E29.101, 257/E29.151, E29.273, E29.296, E33.053, 257/E51.005, E51.022; 438/99, 149
See application file for complete search history.

(56) References Cited

U.S. PATENT DOCUMENTS 8,426,851 B2 * 4/2013 Morosawa et al. ............. 257/43
2004/0046211 A1 3/2004 Shimotsusa et al.
(Continued)

FOREIGN PATENT DOCUMENTS

JP 3913756 2/2007
JP 2007-073559 A 3/2007
(Continued)

*Primary Examiner* — Colleen A Matthews
*Assistant Examiner* — Colleen E Snow
(74) *Attorney, Agent, or Firm* — Michael Best & Friedrich LLP

(57) ABSTRACT

Provided is a thin film transistor capable of improving reliability in the thin film transistor including an oxide semiconductor layer. A thin film transistor including: a gate electrode; a gate insulating film formed on the gate electrode; an oxide semiconductor layer forming a channel region corresponding to the gate electrode on the gate insulating film; a channel protective film formed at least in a region corresponding to the channel region on the oxide semiconductor layer; and a source/drain electrode. A top face and a side face of the oxide semiconductor layer are covered with the source/drain electrode and the channel protective layer on the gate insulating film.

18 Claims, 13 Drawing Sheets

(51) Int. Cl.
  *H01L 29/417*   (2006.01)
  *H01L 29/45*    (2006.01)
  *H01L 27/12*        (2006.01)
  *H01L 27/32*        (2006.01)

(56)           References Cited

U.S. PATENT DOCUMENTS

2005/0173734 A1    8/2005  Yoshioka et al.
2007/0072439 A1*   3/2007  Akimoto et al. ............ 438/795
2007/0087487 A1    4/2007  Honda
2007/0228452 A1   10/2007  Asami
2007/0241327 A1   10/2007  Kim et al.
2008/0197350 A1    8/2008  Park et al.
2010/0051934 A1    3/2010  Choung et al.
2010/0102313 A1    4/2010  Miyairi et al.
2011/0111566 A1    5/2011  Shimamoto et al.
2012/0162561 A1    6/2012  Kimura

FOREIGN PATENT DOCUMENTS

JP      2008-205469 A      9/2008
JP      2009-021480 A      1/2009

* cited by examiner

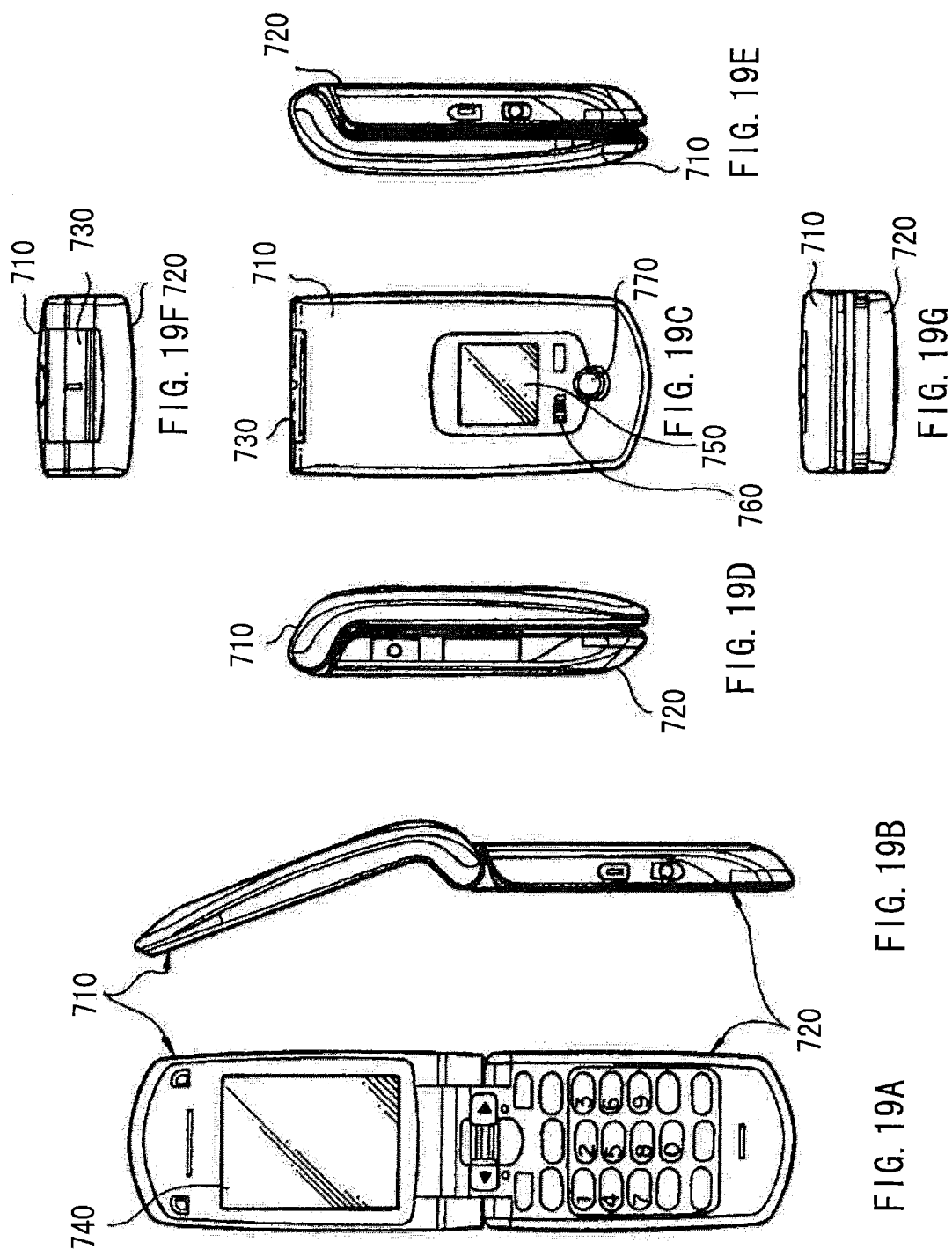

THIN FILM TRANSISTOR AND DISPLAY DEVICE

CROSS REFERENCES TO RELATED APPLICATIONS

This present application is a Continuation Application of patent application Ser. No. 12/654,658, filed Dec. 29, 2009, which claims priority from Japanese Patent Application JP 2009-024035 filed in the Japanese Patent Office on Feb. 4, 2009, the entire contents of which being incorporated herein by reference.

BACKGROUND OF THE INVENTION

1. Field of the Invention

The present invention relates to a thin film transistor (TFT) using an oxide semiconductor layer, and a display device including the same.

2. Description of the Related Art

An oxide semiconductor composed of zinc oxide, indium gallium zinc oxide (IGZO), or the like exhibits excellent characteristics as an active layer of a semiconductor device, and development of the oxide semiconductor has been in progress toward application to a TFT, a light emitting device, a transparent conductive film, and the like in recent years.

For example, the TFT using the oxide semiconductor has high electron mobility, and excellent electric characteristics in comparison with the TFT using amorphous silicon (a-Si:H) as a channel, which has been used in the existing liquid crystal display device. Moreover, the TFT using the oxide semiconductor has an advantage that high mobility may be expected even at a low temperature around a room temperature.

Meanwhile, it is known that the heat resistance of the oxide semiconductor is not sufficient, and oxygen, zinc, or the like is detached in heating treatment during manufacture process of the TFT and the lattice defect is formed. The lattice defect results in formation of an electrically-shallow impurity level, and causes low resistance of the oxide semiconductor layer. Thus, the operation of the oxide semiconductor becomes normally-on type, that is, depression type in which a drain current flows without applying a gate voltage. The defect level is increased, the threshold voltage is reduced, and the leakage current is increased.

By such lattice defect, induction of a carrier in zinc oxide to become the active layer is inhibited, and the carrier concentration is reduced. The reduction of the carrier concentration causes a reduction of electric conductivity of the active layer, and has an influence on electron mobility and current transfer characteristics (for example, subthreshold characteristics and the threshold voltage) of the thin film transistor.

Thus, in the past, for example, it has been proposed that a gate insulating layer in contact with a channel layer of oxide semiconductor is composed of amorphous aluminum oxide ($Al_2O_3$), and the defect level of an interface is reduced (for example, Japanese Publication Patent No. 3913756).

SUMMARY OF THE INVENTION

Here, an oxide semiconductor film has characteristics that the carrier concentration in the semiconductor is highly changed by absorption of moisture.

Thus, to realize the thin film transistor using the oxide semiconductor film as a channel, it is necessary to realize a device structure in which moisture mixing is suppressed. That is, it is desirable to improve reliability by suppressing absorption of moisture in the oxide semiconductor layer.

In view of foregoing, it is desirable to provide a thin film transistor capable of improving reliability in the thin film transistor including an oxide semiconductor layer, and a display device including the same.

According to an embodiment of the present invention, there is provided a thin film transistor including: a gate electrode; a gate insulating film formed on the gate electrode; an oxide semiconductor layer forming channel region corresponding to the gate electrode on the gate insulating film; a channel protective film formed at least in a region corresponding to the channel region on the oxide semiconductor layer; and a source/drain electrode. A top face and a side face of the oxide semiconductor layer are covered with the source/drain electrode and the channel protective film on the gate insulating film.

According to an embodiment of the present invention, there is provided a display device including: a display element and a thin film transistor driving the display element and including a gate electrode, a gate insulating film formed on the gate electrode, an oxide semiconductor layer forming a channel region corresponding to the gate electrode on the gate insulating film, a channel protective film formed at least in a region corresponding to the channel region on the oxide semiconductor layer, and a source/drain electrode. A top face and a side face of the oxide semiconductor layer are covered with the source/drain electrode and the channel protective layer on the gate insulating film.

In the thin film transistor and the display device according to the embodiments of the present invention, the top face and the side face of the oxide semiconductor layer are covered with the source/drain electrode and the channel protective layer on the gate insulating film. Thus, the oxide semiconductor layer is shut off from the external air, and mixing of moisture or the like to the oxide semiconductor layer is suppressed.

According to the thin film transistor and the display device of the embodiments of the present invention, the top face and the side face of the oxide semiconductor layer are covered with the source/drain electrode and the channel protective layer on the gate insulating film. Thereby, mixing of moisture or the like to the oxide semiconductor layer is suppressed, and absorption of the moisture in the oxide semiconductor layer is suppressed. Therefore, it is possible to improve reliability in the thin film transistor including the oxide semiconductor layer.

Other and further objects, features and advantages of the invention will appear more fully from the following description.

BRIEF DESCRIPTION OF THE DRAWINGS

FIG. 19A is an elevation view of a fifth application example unclosed, FIG. 19B is a side view thereof, FIG. 19C is an elevation view of the fifth application example closed, FIG. 19D is a left side view thereof, FIG. 19E is a right side view thereof, FIG. 19F is a top face view thereof, and FIG. 19G is a bottom view thereof.

DETAILED DESCRIPTION OF THE PREFERRED EMBODIMENT

An embodiment of the present invention will be hereinafter described in detail with reference to the drawings. The description will be made in the following order:
1. Embodiment (example where a top face and a side face of an oxide semiconductor layer is covered with a source/drain electrode and a protective film)
2. Modification (example where a protective film (passivation film) is provided in addition to a channel protective layer)
3. Module and application examples

1. Embodiment

Configuration Example of Display Device

Figure 1:
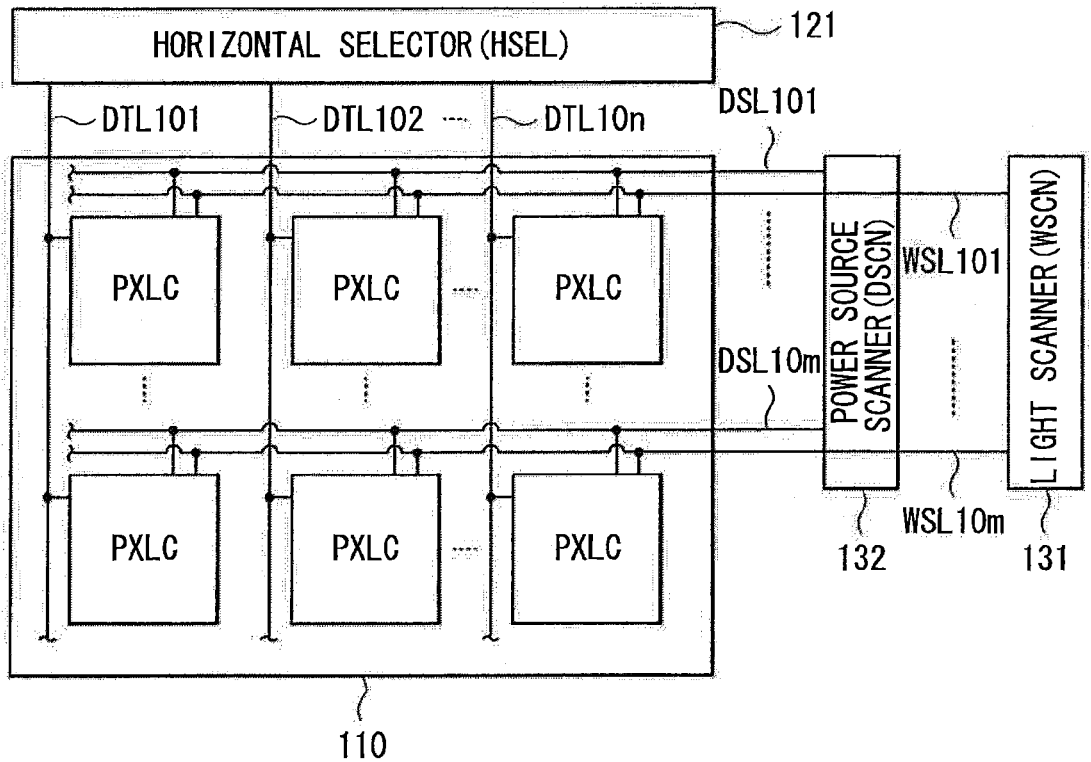
FIG. 1 is a block diagram illustrating the configuration of a display device according to an embodiment of the present invention.

FIG. 1 illustrates the configuration of a display device according to the embodiment of the present invention. This display device is used as an ultrathin organic light emitting color display device or the like. In the display device, for example, a display region 110 in which pixels PXLCs composed of a plurality of organic light emitting elements 10R, 10G, and 10B are arranged in matrix as a display element is formed in a TFT substrate 1. In the periphery of the display region 110, a horizontal selector (HSEL) 121 as a signal section, a light scanner (WSCN) 131 as a scanner section, and a power source scanner (DSCN) 132 are formed.

In the display region 110, signal lines DTL 101 to DTL 10n are arranged in the column direction, and scanning lines WSL 101 to WSL 10m and power source lines DSL 101 to DSL 10m are arranged in the row direction. At each intersection of each signal line DTL and each scanning line WSL, a pixel circuit 140 including the organic light emitting element PXLC (one of the organic light emitting elements 10R, 10G, and 10B (sub-pixel)) is provided. Each signal line DTL is connected to the horizontal selector 121, and a video signal is supplied from the horizontal selector 121 to the signal line DTL. Each scanning line WSL is connected to the light scanner 131. Each power source line DSL is connected to the power source scanner 132.

Figure 2:
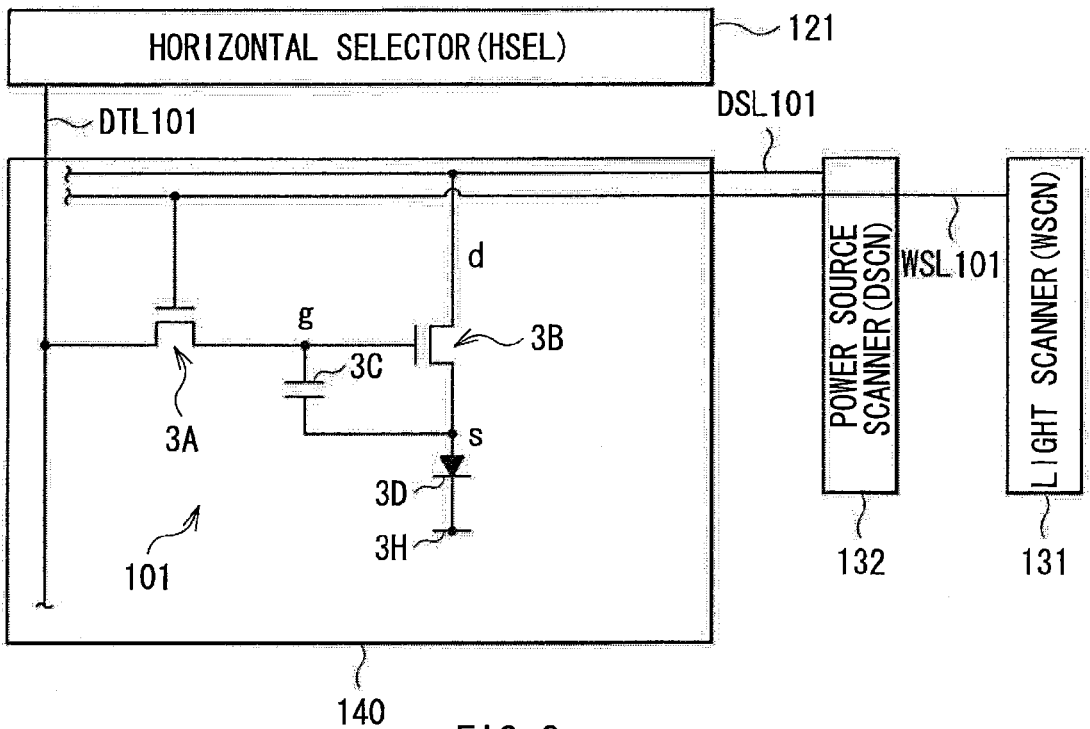
FIG. 2 is an equivalent circuit view illustrating an example of a pixel circuit illustrated in FIG. 1.

FIG. 2 illustrates an example of the pixel circuit 140. The pixel circuit 140 is an active drive circuit including a sampling transistor 3A and a drive transistor 3B, a retention capacity 3C, and a light emitting element 3D composed of the organic light emitting elements PXLC. In the sampling transistor 3A, a gate is connected to the corresponding scanning line WSL 101, one of a source and a drain is connected to the corresponding signal line DTL 101, and the other of the source and the drain is connected to a corresponding gate "g" of the drive transistor 3B. In the drive transistor 3B, a drain "d" is connected to the corresponding power source line DSL 101, and a source "s" is connected to an anode of the light emitting element 3D. A cathode of the light emitting element 3D is connected to a ground wiring 3H. The ground wiring 3H is connected in common to all of the pixels PXLCs. The retention capacity 3C is connected between the source "s" and the gate "g" of the drive transistor 3B.

The sampling transistor 3A is rendered conductive in response to a control signal supplied from the scanning line WSL 101, and samples a signal potential of the video signal supplied from the signal line DTL 101. The sampled signal potential is retained in the retention capacity 3C. The drive transistor 3B receives supply of a current from the power source line DSL 101 in a first potential, and supplies a drive current to the light emitting element 3D according to the signal potential retained in the retention capacity 3C. The light emitting element 3D emits light at luminance according to the signal potential of the video signal with the supplied drive current.

Configuration Example of TFT

Figure 3:
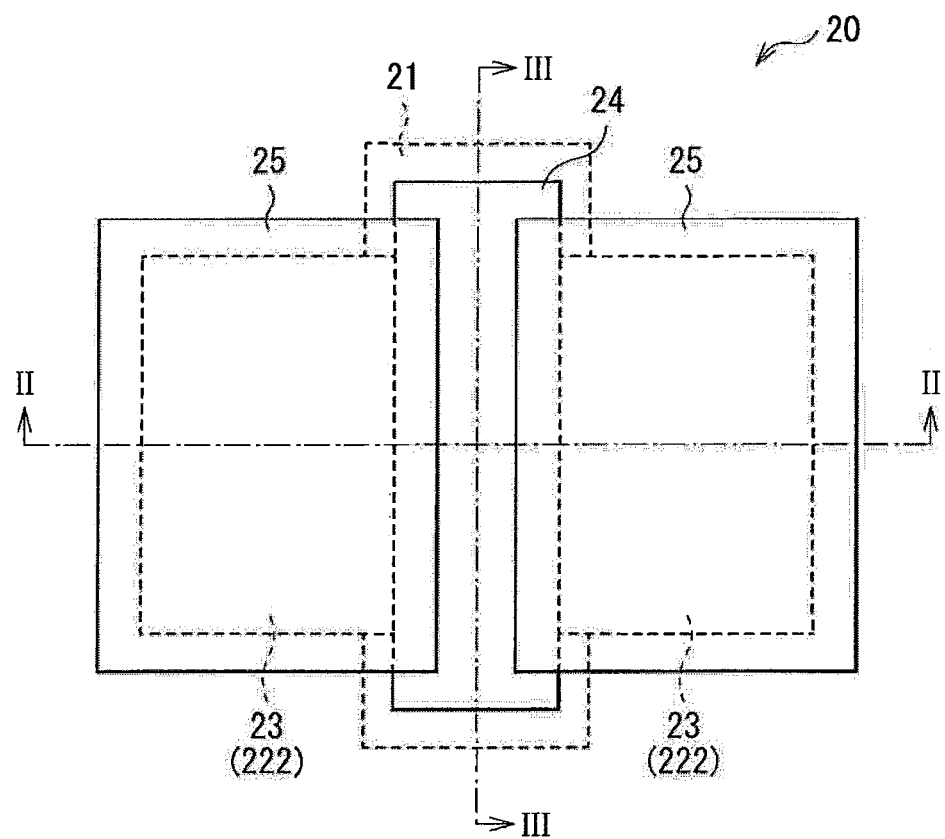
FIG. 3 is a plan view illustrating the configuration of a TFT illustrated in FIG. 2.

FIG. 3 illustrates a plan configuration of a part of the pixel circuit 140 in the TFT substrate 1 (part corresponding to the sampling transistor 3A of FIG. 2). In the TFT substrate 1, for example, a TFT 20 and the like composing the above-described sampling transistor 3A is formed on a substrate 10 made of glass or the like. Although it is omitted in FIG. 3, the drive transistor 3B of FIG. 2 has the configuration similar to that of the TFT 20.

Figure 4A:
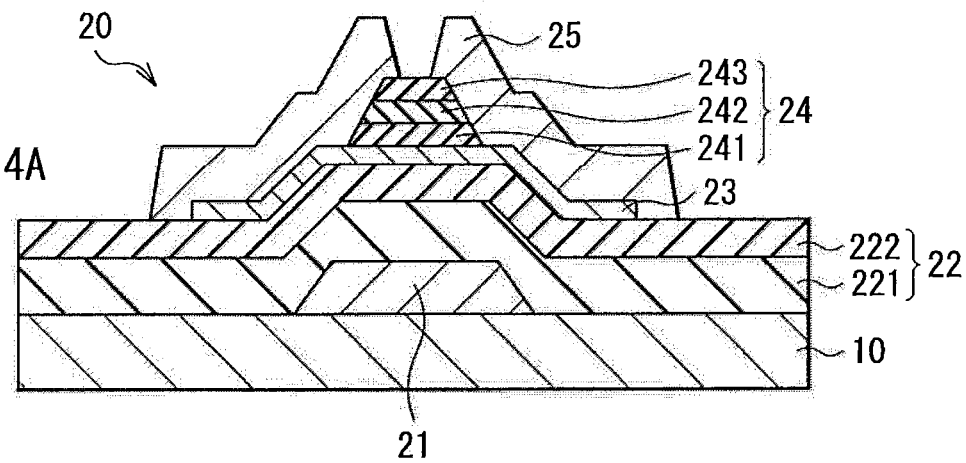
FIGS. 4A and 4B are cross sectional views illustrating the configuration of the TFT illustrated in FIG. 3.
Figure 4B:
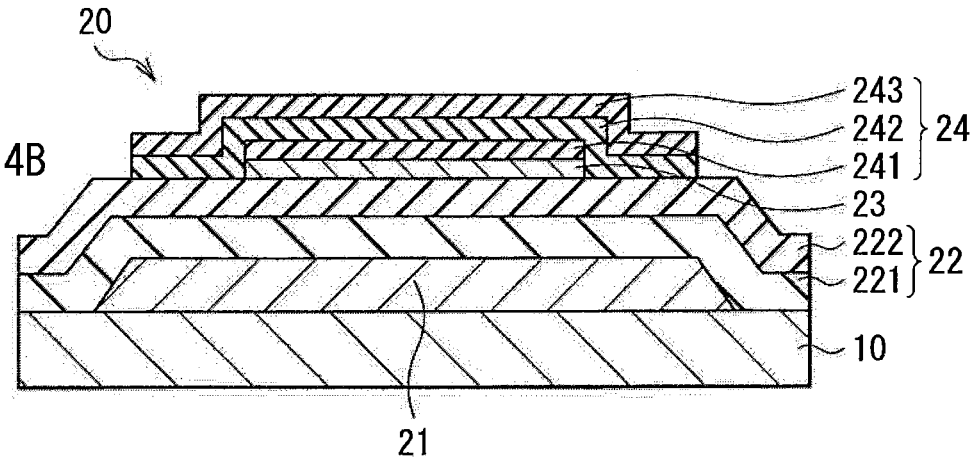

FIGS. 4A and 4B illustrate the cross sectional structure of the TFT 20 illustrated in FIG. 3. FIG. 4A illustrates the cross sectional structure along line II-II of FIG. 3, and FIG. 4B illustrates the cross sectional structure along line III-III of FIG. 3, respectively.

The TFT 20 is, for example, a bottom gate type oxide semiconductor transistor including a gate electrode 21, a gate insulating film 22, an oxide semiconductor layer 23, a channel protective film 24, and a source/drain electrode 25 in this order on the substrate 10. Here, "oxide semiconductor" means oxide of zinc, indium, gallium, tin, or mixture of these, and it is known that the oxide semiconductor exhibits excellent semiconductor characteristics.

Figure 5:
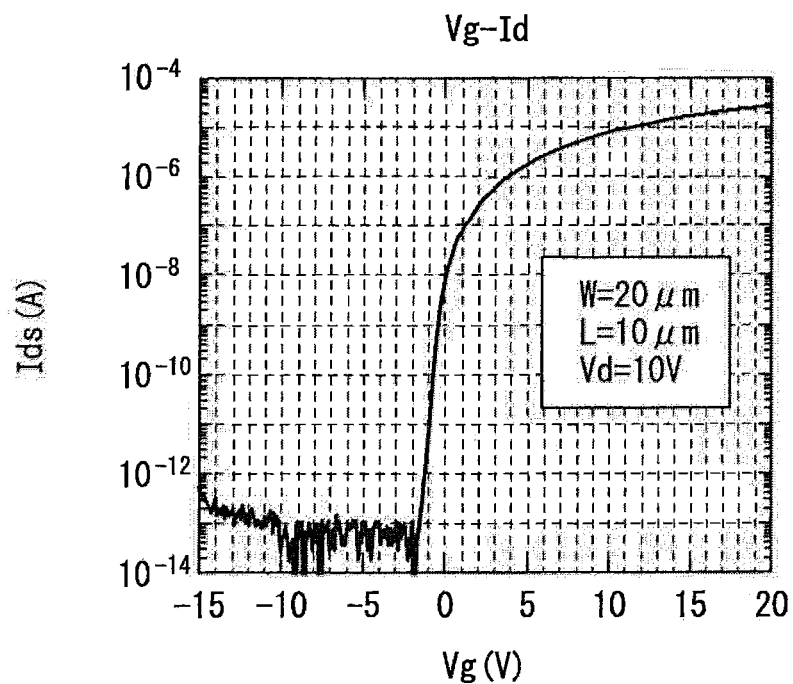
FIG. 5 is a view illustrating a characteristic example of the TFT using an oxide semiconductor.

FIG. 5 illustrates current-voltage characteristics of an oxide semiconductor TFT composed of, for example, mixed oxide of zinc, indium, and gallium (indium gallium zinc oxide: IGZO). The oxide semiconductor indicates electron mobility 10 times to 100 times higher than that of amorphous silicon which has been used as the existing semiconductor, and exhibits favorable off characteristics. Moreover, the oxide semiconductor indicates resistance ⅟₁₀ to ⅟₁₀₀ of that of the existing amorphous silicon, and the threshold voltage may be easily set low, for example, 0 V or less.

The gate electrode 21 controls electron density in the oxide semiconductor layer 23 with a gate voltage applied to the TFT 20. The gate electrode 21 has, for example, a two-layer structure including a molybdenum (Mo) layer having a thickness of 50 nm, and an aluminum (Al) layer or an aluminum alloy layer having a thickness of 400 nm.

The gate insulating film 22 has, for example, a two-layer structure including a gate insulating film 221 having a thickness of approximately 380 nm, and a gate insulating film 222 having a thickness of approximately 20 nm in this order from the substrate 10 side. Such gate insulating films 221 and 222 are composed of a single layer film of a silicon oxide film, a silicon nitride film, a silicon nitride oxide film, an aluminum oxide film, or the like, or a stacked layer film of these. Among them, the aluminum oxide film and the silicon nitride film layer which exhibit high barrier characteristics to moisture and the like are preferably used for the gate insulating films 221 and 222. In that case, it is possible to suppress moisture diffusion from the substrate 10 side.

The oxide semiconductor layer 23 has a thickness of, for example, 50 nm, and is composed of indium gallium zinc oxide (IGZO). In the oxide semiconductor layer 23, a channel region (not illustrated in the figure) is formed corresponding to the gate electrode 21. The oxide semiconductor layer 23 is patterned into an island shape (not illustrated in the figure).

Here, as illustrated in FIGS. 4A and 4B, on the gate insulating film 222, the top face and the side face of the oxide semiconductor layer 23 are covered with the source/drain electrode 25 and the channel protective film 24 which will be described later. Thereby, although the detail will be described later, even when the existing passivation film (protective film) is not formed, the TFT 20 may be stably operated without being influenced by moisture or the like in the air.

The channel protective film 24 is formed at least in a region corresponding to the channel region in the oxide semiconductor layer 23, and has a three-layer structure including channel protective films 241, 242, and 243 in this order from the substrate 10 side. These channel protective films 241 to 243 contain aluminum oxide ($Al_2O_3$) or silicon nitride (SiN or the like), and are specifically composed of an aluminum oxide film, a silicon nitride film, or a silicon oxynitride film. However, among these, at least one layer of the channel protective films 242 and 243 is composed of the aluminum oxide film or the silicon nitride film. The channel protective film 24 having such a structure prevents damage of the channel region in the oxide semiconductor layer 23, and prevents infiltration of hydrogen, moisture, or the like to the oxide semiconductor layer 23. The channel protective film 24 also protects the channel region from resist stripping liquid or the like used at the time of forming the source/drain electrode 25.

Figure 6:
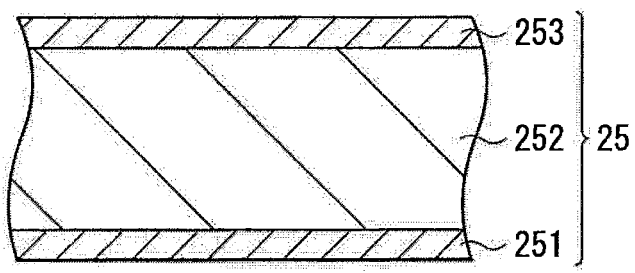
FIG. 6 is a cross sectional view illustrating the detailed configuration of a source/drain electrode illustrated in FIGS. 3, 4A and 4B.

The source/drain electrode 25 is composed of, for example, a multilayer film in which a plurality of metal layers are stacked. Specifically, for example, as illustrated in FIG. 6, the source/drain electrode 25 has, for example, the stacked structure of three layers including a first metal layer 251 having a thickness of approximately 50 nm, a second metal layer 252 having a thickness of approximately 500 nm, and a third metal layer 253 having a thickness of approximately 50 nm Among them, the first metal layer 251 is formed along an interface with the oxide semiconductor layer 23, and the second metal layer 252 and the third metal layer 253 are formed in this order on the first metal layer 251. Such metal layers 251 to 253 are composed of a metal material such as molybdenum (Mo), aluminum (Al), copper (Cu), titanium (Ti), ITO (indium-tin composite oxide), or titanium oxide (TiO), respectively. However, among the metal layers 251 to 253, the first metal layer 251 in contact with the oxide semiconductor layer 23 is preferably composed of a metal material containing molybdenum (Mo) or oxygen (such as ITO and titanium oxide). In this case, it is possible to stabilize electric characteristics of the TFT 20 while suppressing the oxygen detachment in the oxide semiconductor layer 23.

Example of Cross Sectional Configuration of Display Region

Figure 7:
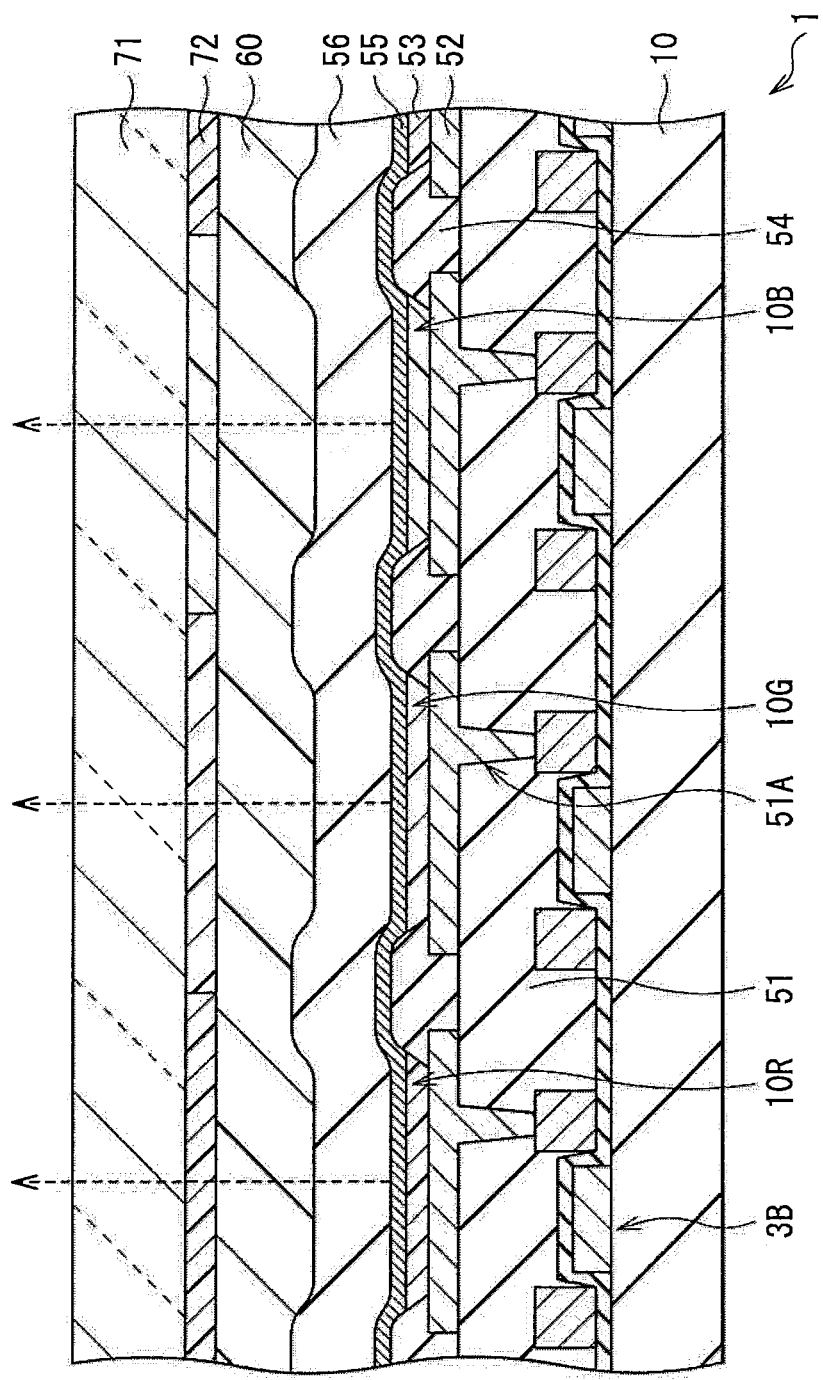
FIG. 7 is a cross sectional view illustrating a configuration example of a display region illustrated in FIG. 1.

FIG. 7 illustrates the cross sectional configuration of the display region 110 illustrated in FIG. 1. In the display region 110, the organic light emitting element 10R emitting red light, the organic light emitting element 10G emitting green light, and the organic light emitting element 10B emitting blue light are formed in this order in matrix as a whole. The organic light emitting elements 10R, 10G, and 10B have a strip planar shape, and a combination of the organic light emitting elements 10R, 10G, and 10B adjacent to each other compose one pixel.

The organic light emitting elements 10R, 10G and 10B have the configuration in which an anode 52, an interelectrode insulating film 54, an organic layer 53 including a light emitting layer which will be described later, and a cathode 55 are stacked in this order on the TFT substrate 1 with a planarizing insulating film 51 in between, respectively.

Such organic light emitting elements 10R, 10G, and 10B are covered with a protective film 56 made of silicon nitride (SiN), silicon oxide (SiO), or the like, if necessary. The organic light emitting elements 10R, 10G, and 10B are sealed by adhering a sealing substrate 71 made of glass or the like onto the whole surface of the protective film 56 with an adhesion layer 60 made of thermal curing resin, ultraviolet curing resin, or the like in between. The sealing substrate 71 may be provided with a color filter 72 and a light blocking film (not illustrated in the figure) as black matrix, if necessary.

The planarizing insulating film 51 is intended to planarize the surface of the TFT substrate 1 in which the pixel circuit 140 is formed, and is preferably composed of a material having a good pattern accuracy to form a fine connecting hole 51A. As the material for the planarizing insulating film 51, for example, there is an organic material such as polyimide, or an inorganic material such as silicon oxide ($SiO_2$). The drive transistor 3B illustrated in FIG. 2 is electrically connected to the anode 52 through the connecting hole 51A provided in the planarizing insulating film 51. Although it is omitted in FIG. 7, a lower layer electrode 31 of the capacitor 30 composing the retention capacity 3C is electrically connected to the anode 52 through a connecting hole (not illustrated in the figure) provided in the planarizing insulating film 51 (refer to FIG. 2).

The anode 52 is formed corresponding to each of the organic light emitting elements 10R, 10G, and 10B. The anode 52 serves as a reflective electrode reflecting light generated in the light emitting layer, and preferably has reflectance as high as possible to increase the light emission efficiency. The anode 52 has a thickness of, for example, 100 nm to 1000 nm both inclusive, and is composed of a single metal element of silver (Ag), aluminum (Al), chrome (Cr), titanium (Ti), iron (Fe), cobalt (Co), nickel (Ni), molybdenum (Mo), copper (Cu), tantalum (Ta), tungsten (W), platinum (Pt), gold (Au), or the like, or an alloy of these.

The interelectrode insulating film 54 is intended to ensure insulation between the anode 52 and the cathode 55 and intended to accurately shape a light emitting region into a desirable shape. The interelectrode insulating film 54 is composed of, for example, an organic material such as polyimide, or an inorganic insulating material such as silicon oxide ($SiO_2$). The interelectrode insulating film 54 has an aperture corresponding to the light emitting region in the anode 52. Although the organic layer 53 and the cathode 55 may be provided not only on the light emitting region but also on the interelectrode insulating film 54 continuously, light is emitted only in the aperture of the interelectrode insulating film 54.

The organic layer 53 has the configuration, for example, in which a hole injection layer, a hole transport layer, a light emitting layer, and an electron transport layer (all not illustrated in the figure) are stacked in this order from the anode 52 side. Among them, the layers other than the light emitting layer may be provided, if necessary. The organic layer 53 may have the different configuration depending on the light emission color of the organic light emitting elements 10R, 10G, and 10B. The hole injection layer is intended to increase the hole injection efficiency, and a buffer layer to prevent leakage. The hole transport layer is intended to increase the hole transport efficiency to the light emitting layer. Recombination of an electron and a hole occurs by applying an electric field, and the light emitting layer generates light. The electron transport layer is intended to increase the electron transport efficiency to the light emitting layer. The material for the organic layer 53 is not specifically limited, as long as it is a typical low polymer organic material or a typical high polymer organic material.

The cathode 55 has a thickness of, for example, 5 nm to 50 nm both inclusive, and is composed of a single metal element of aluminum (Al), magnesium (Mg), calcium (Ca), or sodium (Na), or an alloy of these. Among them, an alloy of magnesium and silver (MgAg alloy), or an alloy of aluminum (Al) and lithium (Li) (AlLi alloy) is preferable. The cathode 55 may be composed of ITO (indium-tin composite oxide), or IZO (indium-zinc composite oxide).

Example of Method of Manufacturing Display Device

The display device may be manufactured, for example, in the following manner.

Step of Forming TFT 20

FIGS. 8A to 8C, and 9 illustrate cross sectional views of an example of a step of forming the TFT substrate 1 including the TFT 20.

Figure 8A:
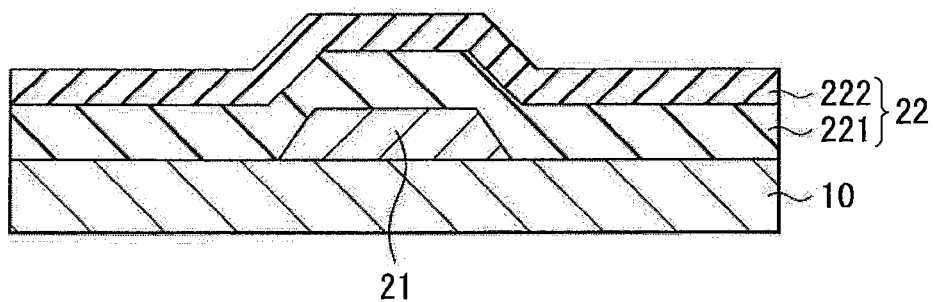
FIGS. 8A to 8C are cross sectional views illustrating an example of a method of forming a TFT substrate (TFT) illustrated in FIGS. 3, 4A, and 4B in step order.

As illustrated in FIG. 8A, for example, a two-layer structure including a molybdenum (Mo) layer having a thickness of 50 nm, and an aluminum (Al) layer or an aluminum alloy layer having a thickness of 400 nm is formed on the substrate 10 made of glass through the use of, for example, sputtering method. Next, photolithography and etching are performed on the two-layer structure, thereby forming the gate electrode 21.

Next, a two-layer structure including a silicon nitride film to become the gate insulating film 221, and a silicon oxide film to become the gate insulating film 222 are formed on the whole surface of the substrate 10 through the use of, for example, sputtering method or plasma CVD (chemical vapor deposition) method. At this time, to give priority to productivity, the whole gate insulating film 22 may be a single layer film of an aluminum oxide film, a silicon oxide film, a silicon oxynitride film, or a silicon nitride film. Since the silicon oxide film or the silicon oxynitride film formed on the silicon nitride film is removed by etching immediately after processing the oxide semiconductor layer 23 into the island shape, it is desirable to form the silicon oxide film or the silicon oxynitride film in a film thickness of 5 nm to 50 nm both inclusive.

Figure 8B:
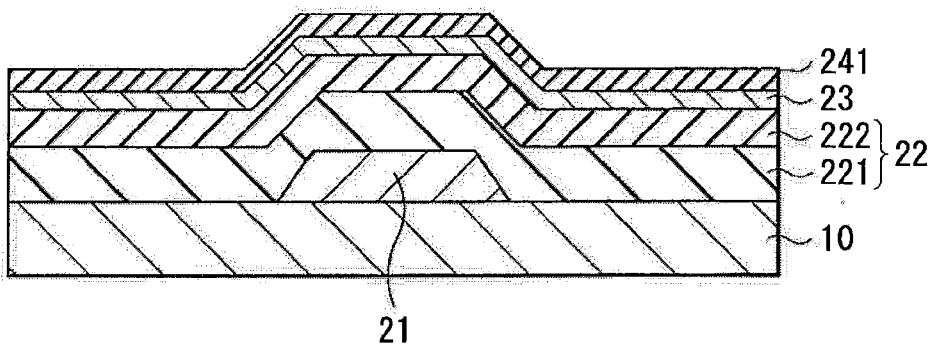

After that, as illustrated in FIG. 8B, an indium gallium zinc oxide (IGZO) film to become the oxide semiconductor layer 23 is formed in a thickness of approximately 5 nm to 100 nm both inclusive through the use of, for example, sputtering method. At that time, for example, in the case where the oxide semiconductor layer 23 is composed of IGZO, DC sputtering method targeting ceramic of IGZO is used, and the oxide semiconductor layer 23 is formed on the substrate 10 through the use of plasma discharge by mixed gas of argon (Ar) and oxygen ($O_2$). Before the plasma discharge, the air in a vacuum container is exhausted until the vacuum level of inside the vacuum container becomes $1 \times 10^{-4}$ Pa or less, and then the mixed gas of argon and oxygen is introduced. For example, in the case where the oxide semiconductor layer 23 is composed of zinc oxide, the oxide semiconductor layer 23 is formed through the use of RF sputtering method targeting ceramic of zinc oxide, or DC sputtering method in a gas atmosphere containing argon and oxygen by using a metal target of zinc.

After forming the oxide semiconductor layer 23, an aluminum oxide film, a silicon oxide film, or a silicon oxynitride film to become the channel protective film 241 is formed in a thickness of, for example, 10 nm to 50 nm both inclusive through the use of, for example, sputtering method or CVD method. At this time, in the case where the aluminum oxide film or the silicon oxide film is formed through the use of sputtering method, it is preferable to continuously form the oxide semiconductor layer 23 and the aluminum oxide film or the like in a sputtering device. Thereby, it is possible to uniform the characteristics of the TFT 20. In the case where priority is given to the productivity, it may proceed to a next step without forming such a channel protective film 241.

Figure 8C:
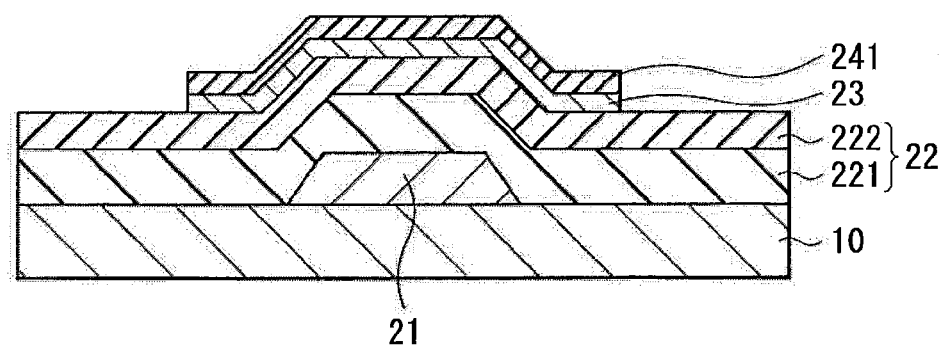

Next, as illustrated in FIG. 8C, the oxide semiconductor layer 23 to become the channel region of the TFT 20, and the channel protective film 241 are formed and patterned into the island shape.

Figure 9A:
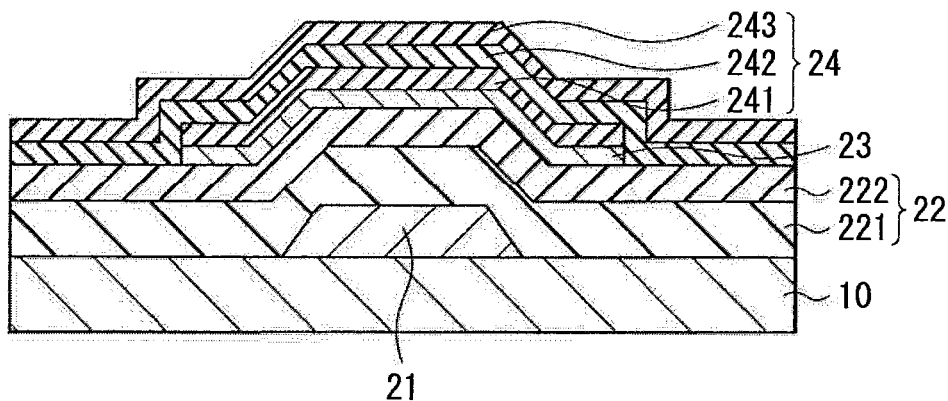
FIGS. 9A and 9B are cross sectional views illustrating a step subsequent to FIGS. 8A to 8C.

Next, as illustrated in FIG. 9A, an oxide aluminum film, a silicon oxide film, or a silicon oxynitride film to become the channel protective films 242 and 243 is formed in a thickness of 100 nm through the use of, for example, CVD method. At this time, for example, the channel protective film 242 may be composed of an aluminum oxide film, and the channel protective film 243 may be composed of a silicon oxide film or silicon oxynitride film. Reversely, the channel protective film 242 may be composed of a silicon oxide film or a silicon oxynitride film, and the channel protective film 243 may be composed of an aluminum oxide film. In the case where the silicon oxide film or the silicon oxynitride film is formed through the use of plasma CVD method or the like, it is possible to easily increase the film thickness of the whole channel protective film 24 to approximately 200 nm which is the necessary thickness in etching for forming the source/drain electrode 25.

Figure 9B:
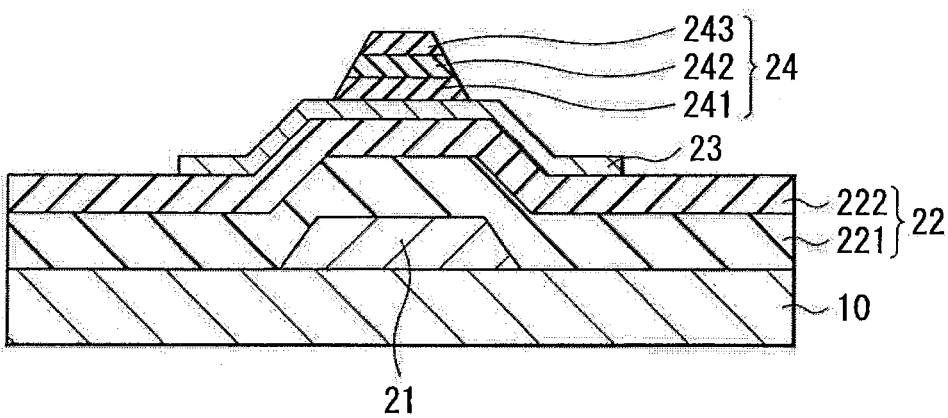

Next, as illustrated in FIG. 9B, photolithography and etching are performed on the aluminum oxide film, the silicon oxide film, or the silicon oxynitride film, thereby shaping the aluminum oxide film, the silicon oxide film, or the silicon oxynitride film into a predetermined shape. Thereby, the channel protective film 24 including the channel protective films 241 to 243 having the shape illustrated in FIG. 4 is formed.

Here, there is an issue that the electric characteristics of the semiconductor in the oxide semiconductor layer 23 are changed by absorption of moisture or the like. Thus, by using the aluminum oxide film as the channel protective film, it is possible to stabilize the electric characteristics of the TFT 20 with excellent gas barrier characteristics of the aluminum oxide film, and it is possible to form the channel protective film without deteriorating the characteristics of the TFT 20. In the case where such an aluminum oxide film is formed through the use of atomic layer deposition (ALD) method, it is possible to form a dense insulating film in the condition where generation of hydrogen deteriorating the electric characteristics of the oxide semiconductor layer 23 is suppressed. Here, in the case where the atomic layer deposition method is used, trimethyl aluminum gas as a raw material gas is introduced into a vacuum chamber, and an aluminum film of an atomic layer is formed on the surface of the substrate 10. Next, an oxygen radical in which an ozone gas or an oxygen gas is excited with plasma is introduced to the surface of the substrate 10, and the aluminum film is oxidized. Since the aluminum film formed first has a thickness of the atomic layer, it is possible to easily oxidize the aluminum film with the ozone or the oxygen radical, and it is possible to form the aluminum oxide film which is uniform on the whole substrate 10. After that, by repeating formation of the aluminum film and the oxidizing process, it is possible to form the channel protective film composed of the aluminum oxide film having a predetermined thickness. In this method, the aluminum oxide film may have a composition which corresponds to the stoichiometric ratio without shortage of the oxygen concentration in the aluminum oxide film. Thus, the composition ratio of aluminum and oxygen may be ideal as 2:3, and the channel protective film having the excellent electric characteristics and the excellent gas barrier characteristics may be formed.

Next, the source/drain electrode 25 is formed on the gate insulating film 222, the oxide semiconductor layer 23, and the channel protective film 24 through the use of, for example, sputtering method. Specifically, for example, a molybdenum layer (first metal layer 251) having a thickness of approximately 50 nm, an aluminum layer (second metal layer 252) having a thickness of approximately 500 nm, and a molybdenum layer (third metal layer 253) having a thickness of 50 nm are formed in this order. The first metal layer 251 to the third metal layer 253 are shaped into a predetermined shape through the use of photolithography and etching (for example, wet etching method using mixed liquid containing phosphoric acid, nitric acid, and acetic acid), respectively. Thereby, the source/drain electrode 25 is formed. As described above, the TFT substrate 1 including the TFT 20 as illustrated in FIGS. 3, 4A and 4B is formed.

Step of Forming Organic Light Emitting Elements 10R, 10G, and 10B

First, photosensitive resin is applied over the whole surface of the TFT substrate 1, and exposure and development are performed on the TFT substrate 1. Thereby, the planarizing insulating film 51 and the connecting hole 51A are formed and burned. Next, the anode 52 made of the above-described material is deposited through the use of, for example, direct sputtering, and is selectively etched through the use of, for example, lithography technique to pattern the anode 52 into a predetermined shape. Next, the interelectrode insulating film 54 having the above-described thickness and made of the above-described material is formed through the use of, for example, CVD method, and the aperture is formed through the use of, for example, lithography method. After that, the organic layer 53 and the cathode 55 made of the above-described material are deposited in this order through the use of, for example, evaporation method, and the organic light emitting elements 10R, 10G, and 10B are formed. Next, the organic light emitting elements 10R, 10G, and 10B are covered with the protective film 56 made of the above-described material.

After that, the adhesion layer 60 is formed on the protective film 56. After that, the color filter 72 is provided, and the sealing substrate 71 made of the above-described material is prepared. The TFT substrate 1 and the sealing substrate 71 are adhered to each other with the adhesion layer 60 in between. As described above, the display region illustrated in FIG. 7 is completed.

Action and Effect of Display Device

Next, the description will be made on action and effect of the display device of this embodiment by comparing with a comparative example.

In the display device of this embodiment, the sampling transistor 3A is rendered conductive in response to the control signal supplied from the scanning line WSL, and the signal potential of the video signal supplied from the signal line DTL is sampled and retained in the retention capacity 3C. The current is supplied from the power source line DSL 101 in the first potential to the drive transistor 3B, and the drive current is supplied to the light emitting element 3D (organic light emitting elements 10R, 10G, and 10B) according to the signal potential retained in the retention capacity 3C. The light emitting element 3D (organic light emitting elements 10R, 10G, and 10B) emits light at luminance according to the signal potential of the video signal with the supplied drive current. This light transmits the cathode 55, the color filter 72, and the sealing substrate 71, and is extracted.

Figure 10:
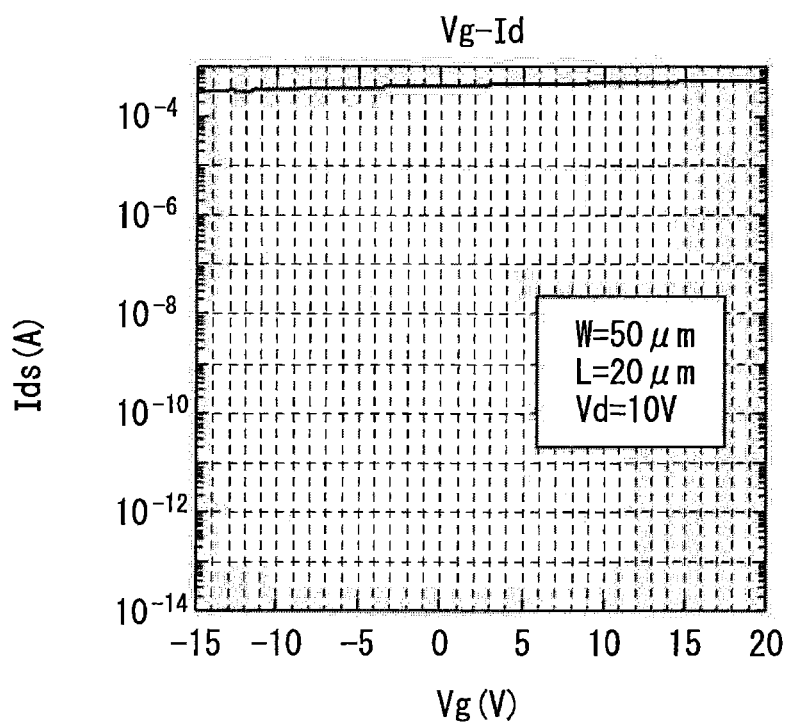
FIG. 10 is a view for explaining influence of detachment of oxygen in the oxide semiconductor on TFT operation.

Here, the heat resistance of the oxide semiconductor is not sufficient, and the oxygen is detached in the heating treatment and the plasma process during the manufacture process of the TFT and the lattice defect is formed. The lattice defect results in formation of the electrically-shallow impurity level, and causes low resistance of the oxide semiconductor. Thus, in the case where the oxide semiconductor is used as the active layer of the TFT, the defect level is increased, the threshold voltage is reduced, and the leakage current is increased, resulting that the operation of the oxide semiconductor becomes depression type in which the drain current flows without applying the gate voltage. When the defect level is sufficiently increased, for example, as illustrated in FIG. 10, the transistor operation is stopped to shift to the conductor operation.

Comparative Example

Figure 11:
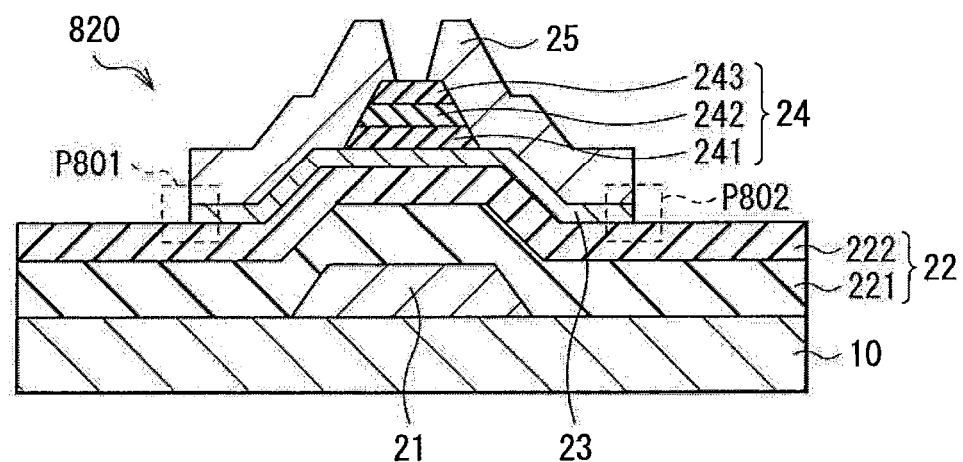
FIG. 11 is a cross sectional view illustrating the configuration of a TFT according to a comparative example.

Thus, in a TFT 820 according to the comparative example whose cross sectional structure is illustrated in FIG. 11, on the gate insulating film 22, the top face of the oxide semiconductor layer 23 is covered with the source/drain electrode 25 and the channel protective film 24. However, in the TFT 820, unlike the TFT 20 of this embodiment, the side face of the oxide semiconductor layer 23 is not covered, and is exposed to the external air (refer to regions of reference numerals P801 and P802 in the figure). Therefore, in the TFT 820, since moisture or the like in the external air is supplied into the oxide semiconductor layer 23, the electric characteristics of the TFT 820 become unstable.

This Embodiment

On the other hand, in this embodiment, on the gate insulating film 22, the top face and the side face of the oxide semiconductor layer 23 are covered with the source/drain electrode 25 and the channel protective film 24. Thereby, unlike the comparative example, the oxide semiconductor 23 is shut off from the external air, and mixing of moisture or the like to the oxide semiconductor layer 23 is suppressed. Therefore, in the TFT 20 of this embodiment, the electric characteristics are stabilized in comparison with those of the TFT 820 of the comparative example.

Figure 12A:
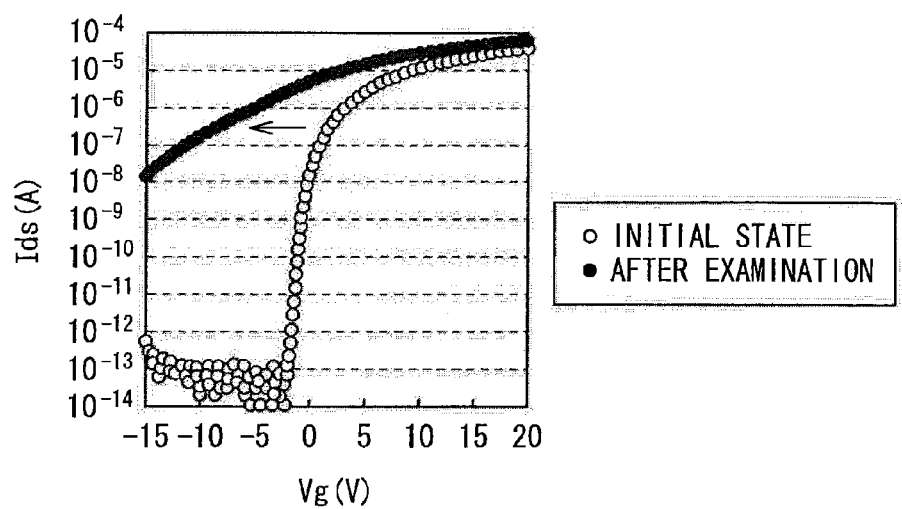
FIGS. 12A and 12B are characteristic views illustrating an example of current-voltage characteristics in the TFT of the comparative example and the TFT of the embodiment.
Figure 12B:
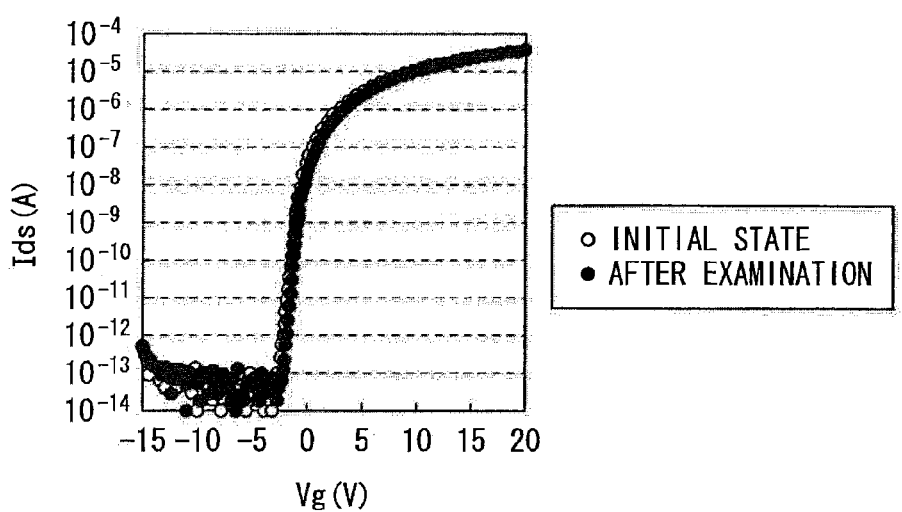

FIGS. 12A and 12B illustrate the change of the characteristics (current-voltage characteristics) indicating the relationship between the gate voltage and the drain current of the thin film transistor, in the case where the thin film transistor is set in a high-temperature high-humidity furnace under an environment of temperature of 60° C. and humidity of 90% for 24 hours. Here, FIG. 12A illustrates the current-voltage characteristics of the TFT 820 according to the comparative example, and FIG. 12B illustrates the current-voltage characteristics of the TFT 20 of this embodiment, respectively. It can be seen that the current-voltage characteristics are hardly changed in the TFT 20 of this embodiment illustrated in FIG. 12B, while the threshold voltage is changed in the minus direction in the TFT 820 of the comparative example illustrated in FIG. 12A.

As described above, in this embodiment, since the top face and the side face of the oxide semiconductor layer 23 are covered with the source/drain electrode 25 and the channel protective film 24 on the gate insulating film 22, mixing of moisture or the like to the oxide semiconductor layer 23 is suppressed, and absorption of the moisture in the oxide semiconductor layer 23 is suppressed. Therefore, it is possible to improve reliability in the thin film transistor including the oxide semiconductor layer.

In the display device using such a TFT 20, it is possible to realize an inexpensive high-quality flat panel display.

2. Modification

Figure 13:
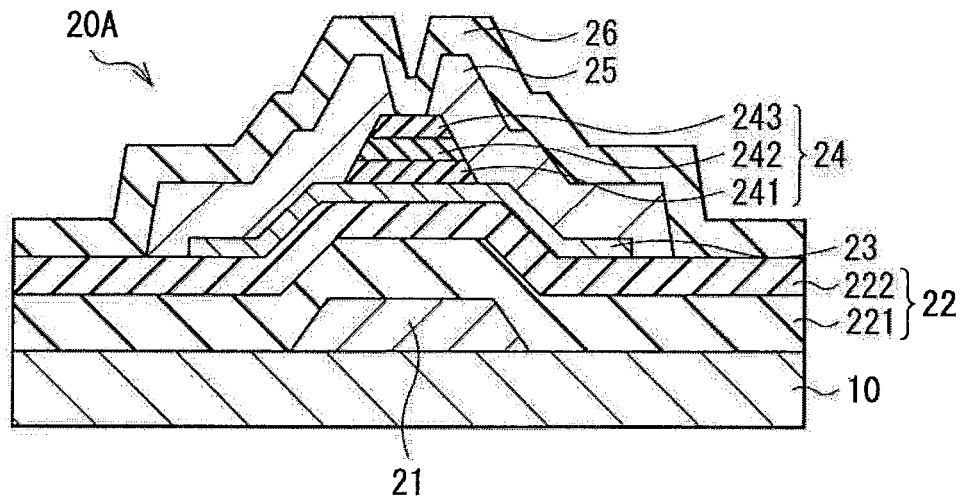
FIG. 13 is a cross sectional view illustrating the configuration of the TFT according to a modification of the present invention.
Figure 14:
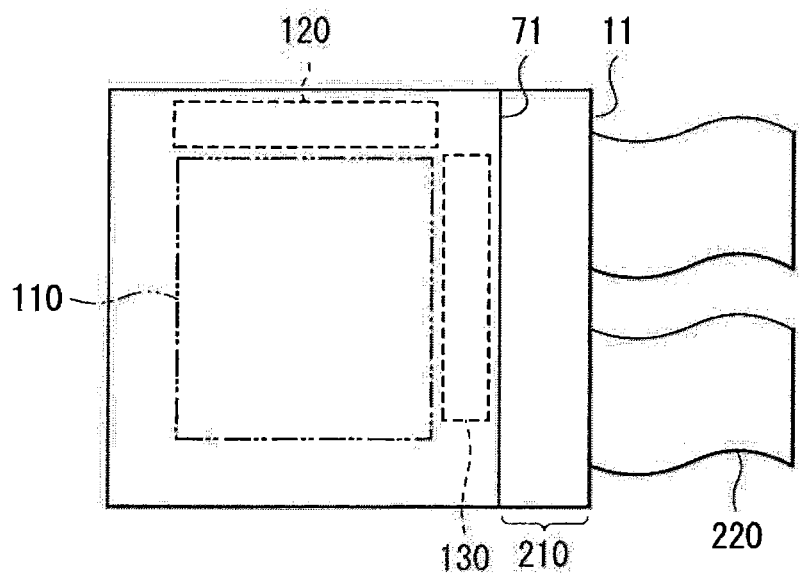
FIG. 14 is a plan view illustrating the schematic configuration of a module including the display device of the embodiment.

FIG. 13 illustrates the cross sectional structure of a TFT 20A according to a modification of the present invention. In the figure, same reference numerals as in the above embodiment have been used to indicate substantially identical components, and thereby the description is appropriately omitted.

In the TFT 20A, in addition to the hitherto-described channel protective film 24, a protective film (passivation film) 26 is provided so as to cover the whole outermost surface of the TFT 20A. In the same manner as the channel protective film 24, such a protective film 26 preferably contains aluminum oxide or silicon nitride, and may be a stacked film including at least one layer of the aluminum oxide film and the silicon nitride film.

In the case of such a configuration, the TFT 20A may be strictly protected from the external moisture or the like, and it is possible to improve the reliability of the thin film transistor more.

3. Module and Application Example

Hereinafter, application examples of the display device which has been described in the above embodiment and the modification will be described. The display device of the above embodiment and the like may be applied to electric devices of various fields such as a television device, a digital camera, a notebook personal computer, a mobile terminal device such as a mobile phone, or a video camera. In other words, the display device of the above embodiment and the like may be applied to display device in electric devices of various fields in which a video signal input from the external or a video signal generated inside the device is displayed as an image or a video.

Module

The display device of the above embodiment is, for example, installed as a module illustrated in FIG. 15 in various electric devices of a first application example to a fifth application example which will be described later. In this module, for example, an exposed region 210 exposed from the sealing substrate 71 and the adhesion layer 60 is provided on one side of a substrate 11, and an external connecting terminal (not illustrated in the figure) is formed by extending wiring of a signal line drive circuit 120 and a scanning line drive circuit 130 in the exposed region 210. In the external connecting terminal, a flexible printed circuit (FPC) 220 may be provided for input/output of a signal.

First Application Example

Figure 15:
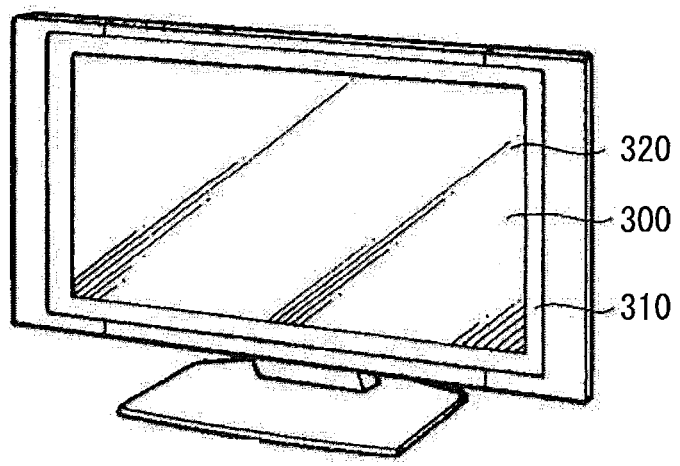
FIG. 15 is a perspective view illustrating an appearance of a first application example of the display device of the embodiment.

FIG. 15 illustrates an appearance of a television device to which the display device of the above embodiment and the like is applied. The television device includes, for example, a video display screen section 300 including a front panel 310 and a filter glass 320. The video display screen section 300 is composed of the display device according to the above embodiment and the like.

Second Application Example

Figure 16A:
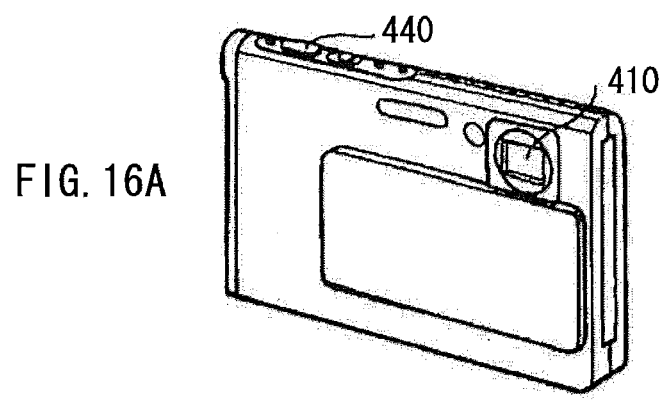
FIG. 16A is a perspective view illustrating an appearance as viewed from a front side of a second application example.
Figure 16B:
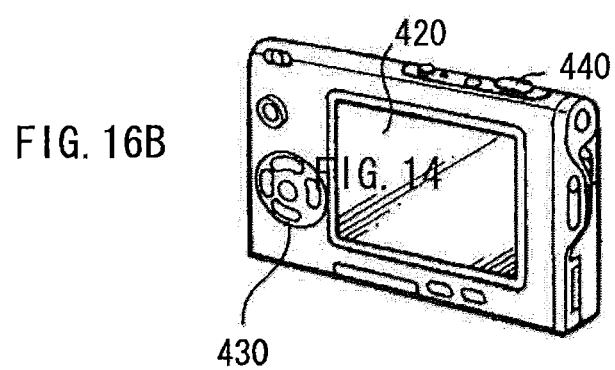
FIG. 16B is a perspective view illustrating an appearance as viewed from a rear side of the second application example.

FIGS. 16A and 16B illustrate an appearance of a digital camera to which the display device of the above embodiment and the like is applied. The digital camera includes, for example, a light emitting section for a flash 410, a display section 420, a menu switch 430, and a shutter button 440. The display section 420 is composed of the display device according to the above embodiment and the like.

Third Application Example

Figure 17:
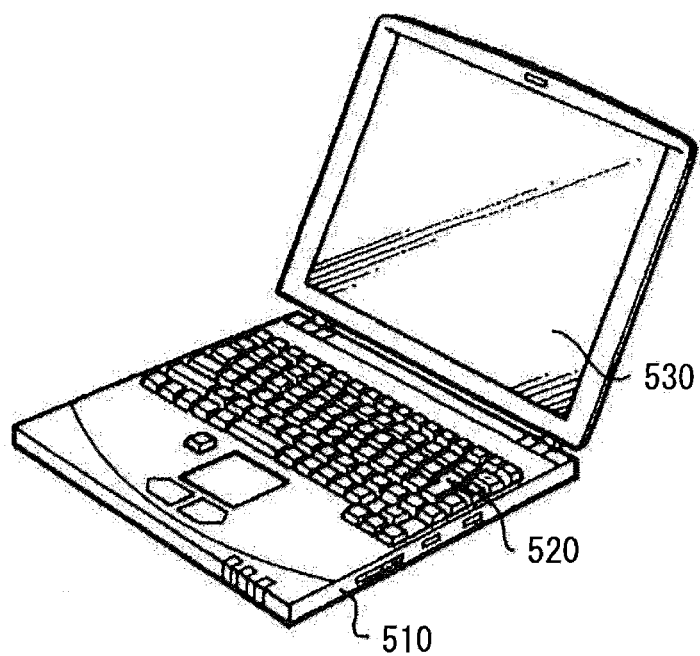
FIG. 17 is a perspective view illustrating an appearance of a third application example.

FIG. 17 illustrates an appearance of a notebook personal computer to which the display device of the above embodiment and the like is applied. The notebook personal computer includes, for example, a main body 510, a keyboard 520 for operation of inputting characters and the like, and a display section 530 for displaying an image. The display section 530 is composed of the display device according to the above embodiment and the like.

Fourth Application Example

Figure 18:
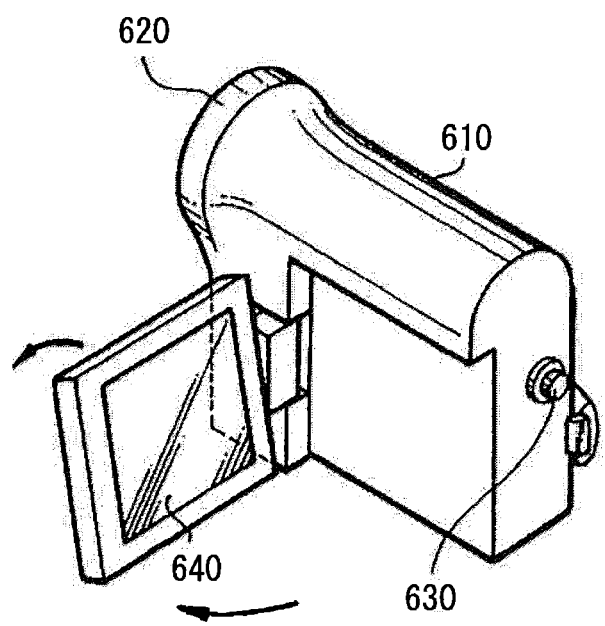
FIG. 18 is a perspective view illustrating an appearance of a fourth application example 4.

FIG. 18 illustrates an appearance of a video camera to which the display device of the above embodiment and the like is applied. The video camera includes, for example, a main body 610, a lens for capturing an object 620 provided on the front side face of the main body 610, a start/stop switch in capturing 630, and a display section 640. The display section 640 is composed of the display device according to the above embodiment and the like.

Fifth Application Example

FIGS. 19A to 19G illustrate an appearance of a mobile phone to which the display device of the above embodiment and the like is applied. In the mobile phone, for example, an upper package 710 and a lower package 720 are jointed by a joint section (hinge section) 730. The mobile phone includes a display 740, a sub-display 750, a picture light 760, and a camera 770. The display 740 or the sub-display 750 is composed of the display device according to the above embodiment and the like.

Hereinbefore, although the present invention has been described with reference to the embodiment, the modification, and the application examples thereof, the present invention is not limited to the embodiment and the like, and various modifications may be made.

For example, the material, the thickness, the film-forming method, the film-forming conditions and the like of each layer are not limited to those described in the above embodiment. Other material, other thickness, other film-forming method, and other film-forming conditions may be adopted.

In the embodiment and the like, the description has been specifically made by using the configuration of the organic light emitting elements 10R, 10B, and 10G. However, it is not always necessary to include all the layers, and other layers may be additionally included.

In addition, the present invention may be applied to a display device using other display element such as a liquid crystal display element, an inorganic electroluminescence element, an electrodeposition type display element, and an electrochromic type display element in addition to the organic EL display element.

The present application contains subject matter related to that disclosed in Japanese Priority Patent Application JP 2009-24035 filed in the Japan Patent Office on Feb. 4, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A thin film transistor comprising:
    a gate insulating film between an oxide semiconductor layer and a gate electrode, said gate electrode being between said gate insulating film and a substrate;
    a source/drain electrode in physical contact with a source/drain region of the oxide semiconductor layer and said gate insulating film, said source/drain region being between said gate insulating film and said source/drain electrode;
    a channel protective film between said source/drain electrode and a different source/drain electrode, a channel region of the oxide semiconductor layer being between said gate insulating film and said channel protective film,
    wherein said channel protective film comprises a second protective film between a first protective film and a third protective film, said second protective film being in physical contact with said first protective film and said third protective film,
    wherein said first protective film is in physical contact with said oxide semiconductor layer, said second protective film being in physical contact with said gate insulating film,
    wherein along every direction within a plan view of a layout, a boundary of the source/drain electrode extends beyond a boundary of the source/drain region.

2. The thin film transistor according to claim 1, wherein said channel protective film is in physical contact with said gate insulating film and said oxide semiconductor.

3. The thin film transistor according to claim 1, wherein said channel protective film is in physical contact with said source/drain electrode and said different source/drain electrode.

4. The thin film transistor according to claim 1, wherein said channel protective film is from the group consisting of an aluminum oxide film, a silicon nitride film, and a silicon oxynitride film.

5. The thin film transistor according to claim 1, wherein said channel region is between said source/drain region and a different source/drain region of the oxide semiconductor layer.

6. The thin film transistor according to claim 5, wherein said different source/drain electrode is in physical contact with said gate insulating film and said different source/drain region.

7. The thin film transistor according to claim 5, wherein along said every direction within the plan view of the layout, a boundary of the different source/drain electrode extends beyond a boundary of the different source/drain region.

8. The thin film transistor according to claim 1, wherein said second protective film is an aluminum oxide film or a silicon nitride film.

9. The thin film transistor according to claim 1, wherein said third protective film is an aluminum oxide film or a silicon nitride film.

10. The thin film transistor according to claim 1, wherein said gate insulating film includes a film from the group consisting of a silicon oxide film, a silicon nitride film, a silicon nitride oxide film, and an aluminum oxide film.

11. The thin film transistor according to claim 1, wherein said gate insulating film includes a first insulating film and a second insulating film, said second insulating film being between said first insulating film and said oxide semiconductor layer.

12. The thin film transistor according to claim 11, wherein said first insulating film is a silicon nitride film.

13. The thin film transistor according to claim 11, wherein said second insulating film is a silicon oxide film.

14. The thin film transistor according to claim 1, wherein said substrate is a glass substrate.

15. The thin film transistor according to claim 1, wherein said oxide semiconductor layer includes an element from the group consisting of zinc, indium, gallium, and tin.

16. The thin film transistor according to claim 1, wherein said source/drain electrode includes a metal material from the group consisting of molybdenum, aluminum, copper, titanium, indium-tin composite oxide, and titanium oxide.

17. The thin film transistor according to claim 1, wherein said source/drain electrode comprises a second metal layer between a first metal layer and a third metal layer, said second metal layer being in physical contact with said first metal layer and said third metal layer.

18. A display device comprising:
    the thin film transistor according to claim 1; and
    a display element, the thin film transistor being configured to drive said display element.

* * * * *